United States Patent [19]

Gileta

[11] Patent Number: 5,113,882
[45] Date of Patent: May 19, 1992

[54] METHOD OF CLEANING WORKPIECES WITH A POTENTIALLY FLAMMABLE OR EXPLOSIVE LIQUID AND DRYING IN THE TUNNEL

[75] Inventor: John Gileta, Chateauguay, Canada
[73] Assignee: Electrovert Ltd., La Prairie, Canada
[21] Appl. No.: 574,342
[22] Filed: Aug. 28, 1990
[51] Int. Cl.⁵ .............................. B08B 3/10; B08B 5/00
[52] U.S. Cl. ..................................... 134/19; 134/21; 134/24; 134/26; 134/30; 134/34; 134/73; 134/105; 134/108
[58] Field of Search .............. 134/9, 21, 11, 24, 18, 134/19, 26, 30, 34, 64 R, 72, 73, 102, 107, 122 R, 902, 105, 108

[56] References Cited

U.S. PATENT DOCUMENTS

| | | | |
|---|---|---|---|
| 2,346,500 | 4/1944 | Moore | 134/18 |
| 3,070,463 | 12/1962 | Barday | 134/11 |
| 3,078,701 | 2/1963 | Rand | 134/11 |
| 3,421,211 | 1/1969 | Eaves et al. | 134/72 |
| 3,552,404 | 1/1971 | Kuhn | 134/15 |
| 4,698,915 | 10/1987 | Dickinson | 134/11 |
| 4,740,247 | 4/1988 | Hayes et al. | 134/26 |

OTHER PUBLICATIONS

Dishart, K. T. and M. C. Wolff, Advantages and Process Options of Hydrocarbon Based Formulations in Semi-Aqueous Cleaning, pp. 513–527.

Primary Examiner—Theodore Morris
Assistant Examiner—Saeed Chaudhry
Attorney, Agent, or Firm—Darby & Darby

[57] ABSTRACT

A dryer system for a liquid cleaning apparatus has a dehumidifier to remove vapors, droplets of liquid cleaning agent and recirculate dry gas onto workpieces moving on a conveyor. The dryer is particularly useful for removing solvents and restricts solvents escaping from the cleaning apparatus. The dryer has an enclosed tunnel from an enclosed liquid containing tank, a conveyor passes from the tank through the tunnel towards an exit. A dehumidifier is associated with the tunnel to remove vapor and liquid particles from atmosphere above the tank and in the tunnel, and supplies dry gas to assist in drying workpieces leaving the tank and passing through the tunnel.

17 Claims, 2 Drawing Sheets

METHOD OF CLEANING WORKPIECES WITH A POTENTIALLY FLAMMABLE OR EXPLOSIVE LIQUID AND DRYING IN THE TUNNEL

TECHNICAL FIELD

This invention relates to liquid cleaning of workpieces such as printed circuit boards and the like upon which electric components have been soldered. More specifically the present invention relates to a liquid cleaning apparatus which has a dryer to remove liquid droplets such as water and/or solvents from workpieces after they have been cleaned.

BACKGROUND ART

After printed circuit boards have passed through a soldering machine and solder has been deposited on terminals and contacts for electrical components, contaminates such as flux, resins and the like remain on the boards and these must be removed by a liquid cleaning agent. Many of the cleaning agents used today have a low flash point and are potentially flammable or explosive when sprayed in air. One cleaning agent used for cleaning printed circuit boards is a terpene based solvent known as Envirosolv KNI. Liquid cleaning machines are generally enclosed, and in some cases inert gas is provided within the enclosure to prevent fire or explosion. One such example of a method and apparatus for cleaning workpieces is disclosed in copending application Ser. No. 456,108 filed Dec. 22, 1989. In this cleaning apparatus workpieces are conveyed on a conveyor down into a tank of solvent or water. The workpieces rise up out of the liquid tank into an enclosed area with liquid seals on both sides. The workpieces are sprayed within this enclosed area. Gas and vapors are contained within this enclosed area and cannot escape through the entrance or the exit of the apparatus. In one embodiment liquid cleaning agent sprays are immersed within the tank containing liquid cleaning agent.

As well as being potentially flammable or explosive, some cleaning agents such as solvents produce strong odors at 1 to 2 ppm in air and therefore it is desirable to restrict solvents from escaping via an entrance or exit of a solvent cleaning apparatus. In batch machines, it is harder to control the release vapors, thus in line machines have an advantage in this respect. In some liquid cleaning machines there is water applied to rinse off the cleaning agent residues from the workpieces before they exit from the cleaning apparatus. Water dilutes any residual cleaning agent on the workpieces, nevertheless unless the workpieces are properly dried and any moisture or cleaning agent removed from the workpieces, the moisture and solvent can evaporate in air outside the machine which causes an unpleasant odour in the work place. Cleaning agent deposits remaining on the boards can cause short circuits during performance tests. Thus there is a need to ensure that workpieces leaving a cleaning apparatus are substantially dry and all cleaning agent and residues are is removed within the cleaning apparatus.

The term "liquid cleaning" agent used throughout the text can include water, water and detergents, saponified cleaning agents and solvents of all kinds. Other cleaning agents that clean workpieces can also be used.

DISCLOSURE OF THE INVENTION

It is an aim of the present invention to provide a liquid cleaning apparatus, which in one embodiment utilizes a strong solvent such as terpene sprayed under immersion, to remove flux residues from printed circuit boards and other types of workpieces. The workpieces are washed with steam or water after the solvent is applied, and then dried before leaving the machine. It is a further aim of the present invention to provide a liquid cleaning apparatus which minimizes replacement air in the machine thus restricts air exiting from the machine with the clean workpieces, and minimizes pollution venting up the vent stack to the atmosphere.

It is a further aim of the present invention to provide a liquid cleaning apparatus wherein gas and vapor within the apparatus are recirculated through a dehumidifier to the vapor. Any excess air is passed to a stack as dry air from the dehumidifier to ensure that there is a minimum quantity of liquid cleaning agent remaining in the air when it exits from the stack or into the work area.

The present invention provides in a liquid cleaning apparatus for cleaning workpieces, the improvement of a dryer for drying the workpieces after cleaning, comprising: an enclosed tunnel from an enclosed liquid containing tank having a conveyor means therein for conveying workpieces from the tank towards an exit, dehumidification means, associated with the tunnel, to remove vapour and liquid particles from atmosphere above the tank and in the tunnel, and supply dry gas to assist in drying workpieces leaving the tank and passing through the tunnel.

The present invention also provides in a solvent cleaning apparatus for cleaning workpieces using a potentially flammable or explosive liquid cleaning solvent, the improvement of a dryer for drying the workpieces after cleaning, comprising an enclosed tunnel from an enclosed liquid containing tank having a conveyor therein for conveying workpieces from the tank towards an exit, and dehumidification means, associated with the tunnel, to remove moisture from atmosphere above the tank and in the tunnel, and supply dry gas to assist in drying workpieces leaving the tank and passing through the tunnel.

In a further embodiment, the present invention also provides a solvent cleaning apparatus for cleaning workpieces using a potentially flammable or explosive liquid cleaning solvent, comprising an enclosure having an entrance and an exit, a conveyor means to carry workpieces from the entrance to the exit, a solvent tank through which the conveyor passes, hot water sprays positioned to spray workpieces on the conveyor after leaving the solvent tank, hot water tank through which the conveyor means passes, drying tunnel extending from the hot water tank to the exit, the conveyor means passing from the hot water tank through the drying tunnel and out of the exit, and dehumidification means associated with the drying tunnel, to remove vapors from atmosphere at least above the hot water tank and circulate dry gas in the drying tunnel in the opposite direction to the conveyor means moving workpieces.

There is also provided in the present invention in a method of cleaning workpieces with a liquid cleaning solvent, wherein workpieces are conveyed on a conveyor in an enclosure through a liquid cleaning agent tank, and then conveyed through an enclosed tunnel to dry the workpieces, the improvement comprising the steps of: withdrawing vapor and gas from at least above the liquid cleaning agent tank, dehumidifying the withdrawn vapor and gas, passing the dehumidified gas through the tunnel in a direction opposite to movement of the workpieces on the conveyor, and heating the workpieces on the conveyor to assist in drying while in the tunnel.

In a still further embodiment of the invention there is provided in a method of cleaning workpieces with a potentially flammable or explosive liquid, comprising the steps of: conveying workpieces on a conveyor into an enclosure having a solvent tank therein, immersing the workpieces in the solvent tank, passing the workpieces under a first liquid seal divider while in the solvent tank, spraying the workpieces with solvent under immersion in the solvent tank, subjecting the workpieces to at least one hot water spray after leaving the solvent tank in an enclosed area between two liquid seal dividers, immersing the workpieces in a hot water tank, passing the workpieces under a second liquid seal divider while in the hot water tank, conveying the workpieces through a drying tunnel, withdrawing vapor and gas from at least above the hot water tank, dehumidifying the withdrawn vapor and gas, passing the dehumidified gas through the drying tunnel in a direction opposite to movement of workpieces on the conveyor, and heating the workpieces to assist in drying while in the drying tunnel.

BRIEF DESCRIPTION OF DRAWINGS

In drawings which illustrate embodiments of the invention.

Figure 1:
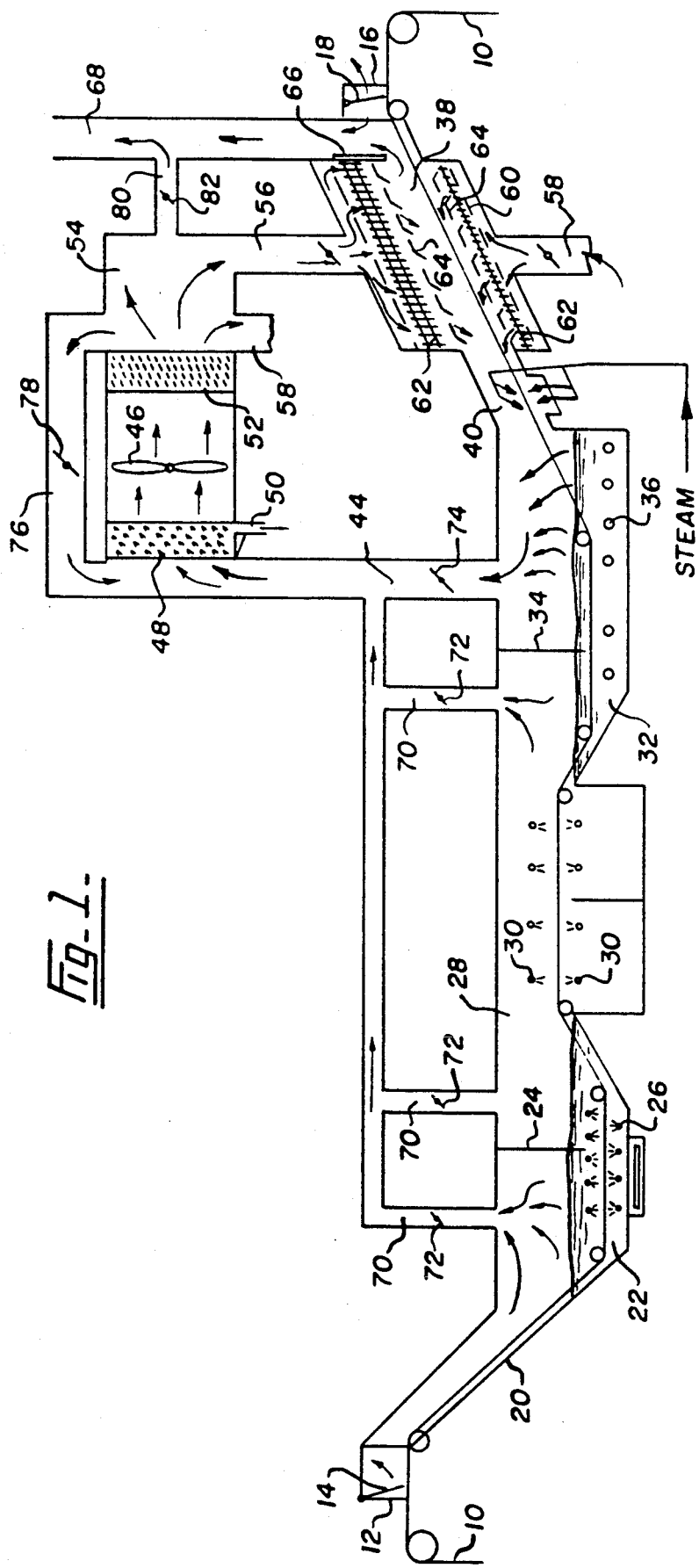
FIG. 1 is a schematic diagram illustrating one embodiment of the present invention.

A liquid cleaning apparatus is illustrated in FIG. 1 wherein a conveyor 10 moves workpieces such as PCBs that have had electrical components soldered thereon, through an entrance 12 which in the embodiment shown has a flap 14 which may be a flexible flap, slotted or hinged at the top to restrict air entering or exiting from within the apparatus but not prevent workpieces passing therethrough. The conveyor 10 passes completely through the liquid cleaning apparatus and out through an exit 16 which has an exit flap 18 therein. The exit flap 18 permits the workpieces sitting on the conveyor 10 to pass therethrough and restricts air from leaving the apparatus. The conveyor 10 passes under the apparatus (which is not shown in the drawing) in an endless belt arrangement well known for conveying systems.

From the entrance 12, the conveyor 10 slopes downwards through an entry tunnel 20 which extends directly into a solvent tank 22 containing solvent. The conveyor passes under a first liquid seal divider 24. The first tank 22 which contains a liquid cleaning agent such as a solvent has a number of immersed cleaning agent sprays 26 above and below the conveyor 10 and cleaning agent is sprayed under pressure within the first tank 22. By spraying under immersion, vaporization of the cleaning agent is kept to a minimum to avoid any possibility of fire or explosion due to the low flash point of the cleaning agent. The cleaning agent within the tank 22 is preferably cooled so that it does not rise above a predetermined temperature. Furthermore the liquid cleaning agent may be vibrated by regular or ultrsonic vibration to assist in removing flux deposits and other residues on the workpieces.

The conveyor 10 rises out of the first tank 22 into an enclosed space 28. The conveyor 10 passes between hot water sprays 30 positioned above and below the conveyor 10. The hot water sprays wash off cleaning agent from the workpieces. The conveyor 10 then passes through a cleaning agent tank 32, which contains hot water, under a second liquid seal divider 34. Thus the enclosed space 28 is between the first liquid seal divider 24 and the second liquid seal divider 34. Heaters 36 in the second tank 32 ensure that the water in the tank is kept hot. The conveyor 10 then passes out of the second tank 32 into an upward sloping drying tunnel 38 which has first of all steam jets 40 or knives positioned to spray in a direction counter to the movement of workpieces on the conveyor 10. The steam jets 40 may be super heated steam to assist in drying the workpieces or alternatively may be normal steam or even hot gas to blow off any water or cleaning agent particles from the workpieces.

Steam and water vapor together with vapors from the cleaning agent are present above the hot water tank 32 and are drawn up through inlet duct 44 by a fan or air blower 46 through a dehumidifier comprising a cooling coil 48 which cools and condenses the water vapor and any cleaning agent vapors present, the resulting condensate falls to the drain 50. Water and cleaning agent are separated in the condensate, with the cleaning agent being reclaimed in a separate step. After passing through the cooling coil 48 the water and cleaning agent vapors have been removed and the substantially dry gas is then passed through a heating coil 52 which together with cooling coil 48 forms a heat exchanger. Dry air is then provided in the plenum 54. Whereas the heating coil 52 is shown to heat the air in a heat exchange arrangement. The heating coil 52 may be separate from the heat exchange arrangement shown. The heat from the heat exchange cycle is dissipated from the condenser cooling coil 48 along with the balance of waste heat. This may be by a fan cooled radiator or a water cooled heat exchanger.

Dry air from the plenum 54 passes through two dry air ducts 56 and 58. The air ducts 56 and 58 provide dry air to be directed at both the top and the bottom of the conveyor 10 and the workpieces thereon. In each case the ducts 56 and 58 direct the air through air diffusers 60 for uniform air flow and finned type heaters 62 followed by air deflectors 64 which direct the air counter to the movement of the conveyor in the drying tunnel 38. Thus hot dry air is blown onto the workpieces after they have passed through the steam jets 40 to ensure that all the remaining moisture on the workpieces is removed.

A vertically adjustable plate 66 is positioned above the top air deflector 64 and at the top of the drying tunnel 38 is an exhaust stack 68 which vents outside the building containing the apparatus. The adjustable plate 66 minimizes the escape of fumes to the exhaust stack 68 and also out of the exit 16. The hot air tends to be drawn up the stack 68 and may pull some air from the drying tunnel 38 and even some air in through the exit 16. Thus little or no air from the drying tunnel 38 exits through the exit 16. This avoids the possibility of odors escaping into the environment around the apparatus. At the same time, the air that does pass up through the stack 68 is dry air wherein water vapor and cleaning agent vapor have been removed. This restricts the pollution problems from the stack and avoids wastage of cleaning agent.

Vents 70 are shown above the first tank 22 before the first liquid seal divider 24 and from within the enclosed area 28, which connect to the inlet duct 44 leading to the dehumidifier. Dampers 72 are provided in these vents 70 thus one is able to fine tune the apparatus to ensure that cleaning agent vapor and water vapor is withdrawn from these areas and dehumidified. This avoids vapors and odors escaping from the entrance 12 of the apparatus. A further damper 74 is positioned in the inlet duct 44 from above the hot water tank 32 and before the duct from the vents 70, so that control of vapors and air entering the inlet duct 44 from above the hot water tank 32 is available. The system can be fine tuned particularly to ensure that vapors do not escape either through the entrance 12 or the exit 16 and that proper drying of the workpieces occur before they leave through the exit 16.

A bypass recirculation duct 76 with a damper 78 is provided around the dehumidifier so that dry air from the heating coil 52 can be recirculated around to the cooling coil 48. The damper 78 provides control of air recirculating through the duct 76 so that air and vapor has more than one dehumidification cycle. A vent duct 80 with a damper 82 is also supplied from the plenum 54 to the vent 68. The damper 82 may be closed or alternatively if air and vapor escape through the exit 16 of the apparatus then a certain amount of dry air from the plenum 54 is allowed to vent directly to the vent stack 68. Steam and odors want to rise up and flow out of the exit 16. The counter flow in the dryer tunnel 38 restricts this flow.

Figure 2:
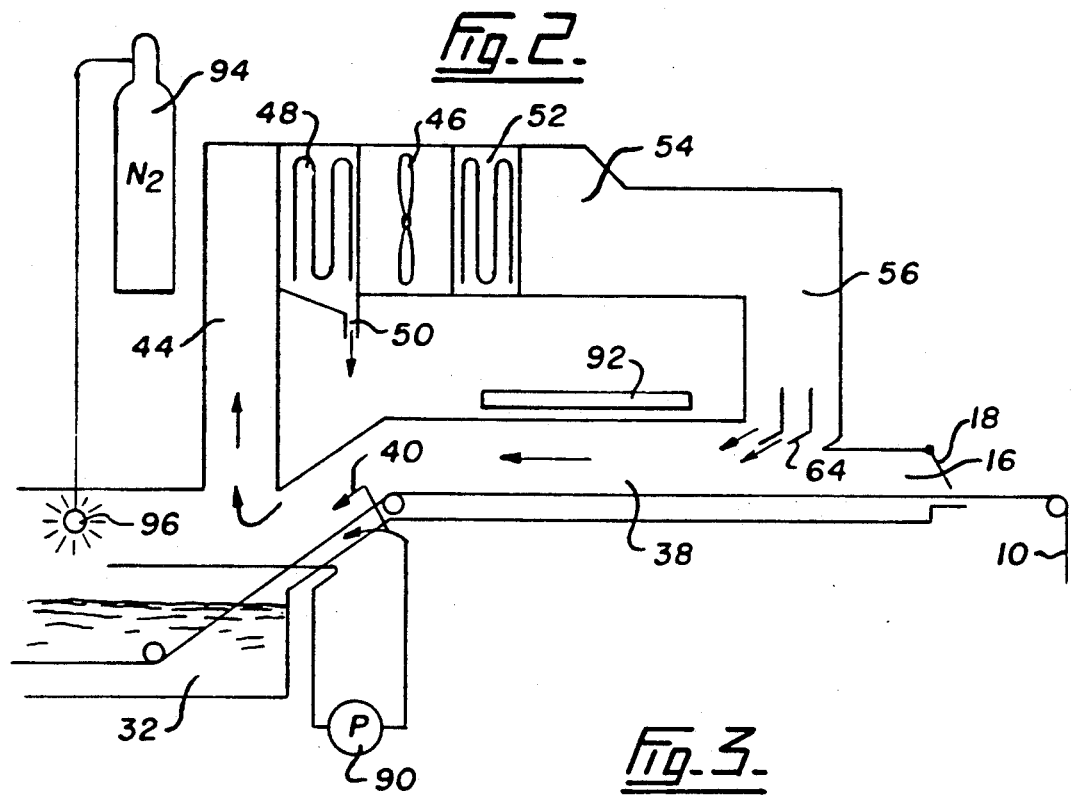
FIG. 2 is a schematic diagram illustrating another embodiment of a drying apparatus according to the present invention.

Another embodiment of a dryer is illustrated in FIG. 2 wherein the dryer tunnel 38 is substantially horizontal rather than sloped, and a mixture of gas and vapors above the hot water tank 32 is withdrawn and passed through a pump 90 and then directed through jets 40 above and below the conveyor 10 to remove water droplets from the workpieces. This utilizes the existing environment inside the cleaning apparatus without introducing air, steam or other gases from outside. As a result, by maintaining what is in effect a closed loop system, fumes, vapors, odors, etc. are mostly kept within the apparatus. Furthermore dry air from the plenum 54 is not passed through a heater as shown in FIG. 1 but is passed directly through deflectors 64 from above the conveyor 10. A heater 92 shown above the drying tunnel 38 provides heat within the tunnel 38. Whereas a heater 92 is shown only above the tunnel 38 it will be apparent to those skilled in the art that one or more heaters may also be placed below the tunnel 38 to heat the air therein.

An inert gas supply 94 such as nitrogen is shown flowing through outlet 96 into the space above or between the tanks and in an area where cleaning agent vapor or gas is present. Nitrogen may also be supplied above the tank 22 and in the enclosed space 30. There is therefore provision to ensure that the atmosphere within the solvent cleaning apparatus is controlled so that the oxygen is limited. This assists in avoiding any possibility of fire or explosion occurring particularly above the solvent tank. Nitrogen may be fed continuously into the apparatus or monitored and controlled to ensure that oxygen within the apparatus is kept below the potential fire or explosive level.

Figure 3:
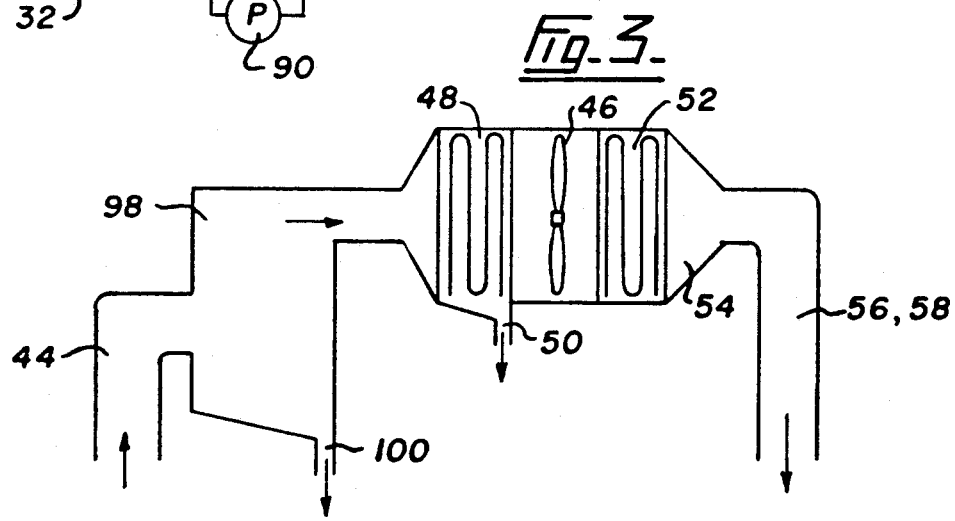
FIG. 3 is a schematic diagram illustrating a condenser and dehumidifier suitable for drying gas.

FIG. 3 illustrates another embodiment wherein a condenser is provided in the inlet duct 44 leading to the dehumidifier. In certain circumstances where steam and liquid vapor are plentiful within the inlet duct 44, it is preferable to pass through a condensing stage before passing to the dehumidifier. In FIG. 3 a condenser 98 comprises a duct, tank or container having a fairly large volume wherein the sides of the tank or container are cooled to provide provision for condensing the vapors on the sides and a drain 100 is provided at the bottom of the condenser 98 to drain the condensate away for further processing. In the further processing the cleaning agent, such as solvent is separated from the water. The condenser can reduce the energy requirements for the dehumidifier. Other suitable separators wherein vapor, moisture or liquid droplets are separated from gas in the inlet duct 44 serves the same purpose as the condenser shown herein. The condenser or separator removes as much liquid or condensed vapor as possible.

The cleaning agent disclosed herein is primarily a terpene based solvent, however other compounds such as BHT (butylated hydroxy toluene) may be present as a deoxidant. The cleaning agent may also be water or a suitable liquid detergent.

In FIG. 1, the cleaning agent sprays 26 under immersion in the first tank 22 is shown to occur both before and after the first liquid seal divider 24. In a preferred embodiment the cleaning agent sprays 26 are located only after the liquid seal divider 24. A cooling coil may be provided in the liquid tank 22 to ensure the temperature of the cleaning agent does not rise too high so that excess vaporization occurs. Cold water can be used in the cooling coil to remove heat generated by pump friction for pumping cleaning agent to the spray nozzles 26. For some cleaning agents, where vaporization is not a problem, heaters may be provided in place of coolers. Sensors may be provided in the first tank 22 for cleaning agent level and in the water tank 32 for water level. Additional cleaning agent liquid and water can be added as required.

The dryer system of the present invention may be retrofitted onto existing cleaning machines which use liquid cleaning agents.

Various changes may be made to the embodiments shown herein without departing from the scope of the present invention which is limited only by the following claims.

The embodiments of the present invention in which an exclusive property or privilege is claimed are defined as follows:

1. In a method of cleaning workpieces with a potentially flammable or explosive liquid cleaning solvent, wherein workpieces are conveyed on a conveyor in an enclosure through a solvent tank followed by a hot water tank, and then conveyed through an enclosed tunnel to dry the workpieces, the improvement comprising the steps of:
   withdrawing vapor and gas from at least above the hot water tank,
   dehumidifying the withdrawn vapor and gas,
   recirculating the dehumidified gas through the tunnel only in a direction opposite to movement of the workpieces on the conveyor, and
   heating the workpieces on the conveyor to assist in drying while in the tunnel.

2. The method of cleaning workpieces according to claim 1 wherein the vapor and gas are withdrawn from above the solvent tank and above the hot water tank.

3. The method of cleaning workpieces according to claim 2 wherein the circulation of vapor and gas withdrawn from about the solvent tank and above the hot water tank is controlled by damper means.

4. The method of cleaning workpieces according to claim 1 wherein excess dehumidified vapor and gas is passed to a vent stack, and wherein damper means is provided to control circulation of vapors and gas in such a manner that little or none escapes through an entrance or an exit of the enclosure where the conveyor enters and leaves the enclosure.

5. The method of cleaning workpieces according to claim 1 wherein dehumidified vapor and gas is recirculated and dehumidified more than once.

6. The method of cleaning workpieces according to claim 1 wherein jets are provided above and below the workpieces conveyed through the tunnel to blow liquid off the workpieces.

7. The method of cleaning workpieces according to claim 1 wherein the solvent is terpene based.

8. The method of cleaning workpieces according to claim 1 including condensing a portion of the withdrawn vapor and gas prior to dehumidifying.

9. The method of cleaning workpieces according to claim 1 including the addition of inert gas above the solvent tank and above the hot water tank.

10. In a method of cleaning workpieces with a potentially flammable or explosive liquid, comprising the steps of:
    conveying workpieces on a conveyor into an enclosure having a solvent tank therein,
    immersing the workpieces in the solvent tank,
    passing the workpieces under a first liquid seal divider while in the solvent tank,
    spraying the workpieces with solvent under immersion in the solvent tank,
    subjecting the workpieces to at least one hot water spray after leaving the solvent tank in an enclosed area between two liquid seal dividers,
    immersing the workpieces in a hot water tank,
    passing the workpieces under a second liquid seal divider while in the hot water tank,
    conveying the workpieces through a drying tunnel,
    withdrawing vapor and gas from at least above the hot water tank,
    dehumidifying the withdrawn vapor and gas,
    passing the dehumidified gas through the drying tunnel in a direction opposite to movement of the workpieces on the conveyor, and
    heating the workpieces to assist in drying while in the drying tunnel.

11. The method of cleaning workpieces according to claim 10 wherein vapor and gas are withdrawn from above the solvent tank, above the hot water spray in the enclosed area, and above the hot water tank, and wherein the circulation of vapor and gas from above the solvent tank, above the hot water spray in the enclosed area, and above the hot water tank, are controlled by damper means.

12. The method of cleaning workpieces according to claim 10 wherein excess dehumidified gas is fed to a vent stack and wherein damper means is provided to control circulation of vapor and gas in such a manner that little or none escapes through an entrance or an exit of the enclosure where the conveyor enters or leaves the enclosure.

13. The method of cleaning workpieces according to claim 10 wherein the dehumidified gas is applied above and below the workpieces in the drying tunnel.

14. The method of cleaning workpieces according to claim 10 wherein the dehumidified gas is heated.

15. The method of cleaning workpieces according to claim 10 wherein the solvent is terpene based.

16. The method of cleaning workpieces according to claim 10 including the step of condensing the withdrawn vapor and gas prior to dehumidifying.

17. The method of cleaning workpieces according to claim 10 wherein inert gas is added to the enclosure above the solvent tank, above the hot water spray in the enclosed area and above the hot water tank.

* * * * *